(12) United States Patent
Baik et al.

(10) Patent No.: US 7,132,710 B2
(45) Date of Patent: Nov. 7, 2006

(54) CAPACITOR, SEMICONDUCTOR DEVICE HAVING THE SAME, AND METHOD OF MANUFACTURING THE SEMICONDUCTOR DEVICE

(75) Inventors: Hion-suck Baik, Chungcheongnam-do (KR); Jung-hyun Lee, Gyeonggi-do (KR); Jong-bong Park, Gyeonggi-do (KR); Yun-chang Park, Gyeonggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 10/902,824

(22) Filed: Aug. 2, 2004

(65) Prior Publication Data

US 2005/0087789 A1 Apr. 28, 2005

(30) Foreign Application Priority Data

Oct. 27, 2003 (KR) .................... 10-2003-0075218

(51) Int. Cl.
*H01L 29/92* (2006.01)
(52) U.S. Cl. .............. 257/306; 257/310; 257/311; 257/532
(58) Field of Classification Search .......... 257/296, 257/300, 306, 310, 311, 532, E27.048, E27.071
See application file for complete search history.

(56) References Cited

U.S. PATENT DOCUMENTS 5,626,906 A * 5/1997 Summerfelt et al. ...... 427/126.3
6,376,787 B1 * 4/2002 Martin et al. ............... 200/181
6,437,967 B1 * 8/2002 Quick et al. ............. 361/306.1
6,753,618 B1 * 6/2004 Basceri et al. .............. 257/296
2002/0195633 A1 * 12/2002 Nagano et al. ............. 257/296
2005/0082586 A1 * 4/2005 Tu et al. ..................... 257/296

\* cited by examiner

*Primary Examiner*—George R Fourson
*Assistant Examiner*—Joannie Adelle García
(74) *Attorney, Agent, or Firm*—Buchanan Ingersoll & Rooney PC

(57) ABSTRACT

A semiconductor device with a stack type capacitor having a lower electrode formed of an aluminum-doped metal, and a manufacturing method thereof are provided. The semiconductor device includes: a semiconductor substrate having a gate structure and an active region; an interlayer dielectric film formed on the active region; a lower electrode formed of a metal containing aluminum on the interlayer dielectric film; a dielectric layer formed on the lower electrode; an upper electrode formed on the dielectric layer; and a plug formed in the interlayer dielectric film to electrically connect the active region with the lower electrode. The method includes: forming a gate structure and an active region on a semiconductor substrate; forming an interlayer dielectric film on the resultant semiconductor substrate; forming a plug in the interlayer dielectric film to electrically connect with the active region; forming a mold oxidation layer on the plug and the interlayer dielectric film; patterning the mold oxidation layer with a predetermined pattern and forming a lower electrode of material containing aluminum on the plug; and sequentially forming a dielectric layer and an upper electrode on the lower electrode.

6 Claims, 17 Drawing Sheets

CAPACITOR, SEMICONDUCTOR DEVICE HAVING THE SAME, AND METHOD OF MANUFACTURING THE SEMICONDUCTOR DEVICE

BACKGROUND OF THE INVENTION

This application claims the priority of Korean Patent Application No. 2003-75218, filed on Oct. 27, 2003, in the Korean Intellectual Property Office, the disclosure of which is incorporated herein in its entirety by reference.

FIELD OF THE INVENTION

The present invention relates to a method of manufacturing a semiconductor device, and more particularly, to a semiconductor device with a stack type capacitor having a lower electrode formed of an aluminum-doped metal, and a method of manufacturing the semiconductor device.

DESCRIPTION OF THE RELATED ART

As the level of integration of a semiconductor device becomes higher, an occupation area of a capacitor is reduced in a memory cell. The resultant reduction of cell capacitance causes hindrance in increasing the level of integration of a Dynamic Random Access Memory (DRAM).

To solve the above drawback caused by the reduction of the cell capacitance, a capacitor area should be secured. For this, a study has been vigorously progressed to increase capacitance by providing a lower electrode having a cylindrical or semispherical shape to increase a spatial area, or applying a dielectric film of a high dielectric constant to a capacitor.

Since the dielectric film uses material, which has the high dielectric constant and uses reaction gas containing oxygen, to increase the capacitance, a very serious drawback of oxidation occurs when the capacitor is formed.

FIG. 1 is a sectional view illustrating a conventional semiconductor device with a capacitor structure using a high dielectric film.

As shown in FIG. 1, the conventional semiconductor device 10 includes a semiconductor substrate 12; a source and drain region 14 formed at a predetermined distance in the semiconductor substrate 12; a gate structure electrically connected to the source and drain region 14; an interlayer dielectric film 19 for performing interlayer insulation; a lower electrode 22 sequentially formed on the interlayer dielectric film 19; a dielectric layer 24 having a high dielectric constant; and an upper electrode 26. Also, a conductive plug 18 passes through the interlayer dielectric film 19 to connect the lower electrode 22 with the source and drain region 14. A TiN layer 20 is formed as a diffusion prevention film on the conductive plug 18.

The lower electrode 22 is generally formed of TiN. However, due to reaction gas $O_3$ that is used to deposit the dielectric layer 24 with the high dielectric constant, TiN of the lower electrode 22 that underlies the dielectric layer 24 is easily oxidized to cause internal stress. Accordingly, the conventional semiconductor device has a drawback in that a gate stack is collapsed and the dielectric layer 24 with the high dielectric constant is not formed.

FIG. 2 is a photograph illustrating a configuration in which the TiO layer is formed on the TiN layer due to the influence of $O_3$ and a H—k oxide that are used when the capacitor structure is manufactured.

As shown in FIG. 2, the TiN layer is oxidized to form the TiO layer thereon due to the influence of $O_3$ and the H—k oxide that are used when the dielectric layer formed of $LaO_x$ with the high dielectric constant is formed on the lower electrode formed of TiN. This phenomenon occurs even in a $HfO_2$-based H—k process as well as a $LaO_x$-based H—k process, and causes the capacitor stack to be collapsed.

SUMMARY OF THE INVENTION

The present invention provides a stack type capacitor in which a lower electrode is formed of TiAlN with oxidation resistance, which is obtained using a negativity of Al-ligand to react with a metal precursor and using $NH_3$, to be prevented from being oxidized even when a subsequential process is performed using a reaction gas containing oxygen.

The present invention also provides a stack type capacitor in which a diffusion prevention film underlying a lower electrode is formed of TiAlN with oxidation resistance to prevent the lower electrode from being oxidized even when a subsequential process is performed using a reaction gas containing oxygen.

The present invention also provides a method of manufacturing a stack type capacitor in which oxidation can be prevented even when a manufacture process is performed using oxygen as reaction gas.

The present invention also provides a semiconductor device having a stack type capacitor in which oxidation can be prevented even when a manufacture process is performed using oxygen as reaction gas.

The present invention also provides a method of manufacturing a semiconductor device having a stack type capacitor in which oxidation can be prevented even when a manufacture process is performed using oxygen as reaction gas.

According to an aspect of the present invention, there is provided a capacitor including: a lower electrode formed of a metal containing aluminum; a dielectric layer formed using a reaction gas containing oxygen on the lower electrode; and an upper electrode formed on the dielectric layer.

According to another aspect of the present invention, there is provided a semiconductor device having a capacitor, the semiconductor device including: a semiconductor substrate having a gate structure and an active region; an interlayer dielectric film formed on the active region; a lower electrode formed of a metal containing aluminum on the interlayer dielectric film; a dielectric layer formed on the lower electrode; an upper electrode formed on the dielectric layer; and a plug formed in the interlayer dielectric film to electrically connect the active region with the lower electrode.

According to a further aspect of the present invention, there is provided a method of manufacturing a semiconductor device having a capacitor, the method including: forming a gate structure and an active region on a semiconductor substrate; forming an interlayer dielectric film on the resultant semiconductor substrate; forming a plug in the interlayer dielectric film to electrically connect with the active region; forming a mold oxidation layer on the plug and the interlayer dielectric film; patterning the mold oxidation layer with a predetermined pattern and forming a lower electrode of material containing aluminum on the plug; and sequentially forming a dielectric layer and an upper electrode on the lower electrode.

According to a still further aspect of the present invention, there is provided a method of manufacturing a semiconductor device having a capacitor, the method including: forming a gate structure and a source and drain region on a semiconductor substrate; forming an interlayer dielectric film on the resultant semiconductor substrate; forming a plug in the interlayer dielectric film to electrically connect with the source and drain region; forming a diffusion prevention film of material containing aluminum on the plug; forming a mold oxidation layer on the diffusion prevention film and the interlayer dielectric film; patterning the mold oxidation layer with a predetermined pattern and then forming a lower electrode of material containing aluminum on the plug; and sequentially forming a dielectric layer and an upper electrode on the lower electrode.

The lower electrode may be formed of a material containing Titanium aluminum nitride (TiAlN) or tantalum aluminum nitride (TaAlN).

Further, if the lower electrode is formed of TiAlN or TaAlN, the upper electrode is formed of a material containing ruthenium (Ru) or titanium (Ti), or the dielectric layer is formed of a material containing $LaO_x$ or $HfO_x$.

Furthermore, if the diffusion prevention film is formed of a material containing TiAlN or TaAlN, oxidation drawback is not caused even when the lower electrode is formed of a material containing Ru or Ti, or the dielectric layer comprises $LaO_x$ or $HfO_x$, or the upper electrode is formed of a material containing Ru or TiN.

Additionally, the lower electrode and the diffusion prevention film are formed by flowing a mixture gas of a material, such as $TiA_4$, and an aluminum ligand, such as trimethyl aluminum ($Al[(CH_3)_3]$), over the semiconductor substrate with the plug to form a TiAl layer while HA and $CO_2$ emit out in gas form; and flowing $NH_3$ over the TiAl layer to form a TiAlN layer while HA emits out in gas form.

According to the present invention, the lower electrode can be prevented from being oxidized when the dielecric film is formed, thereby preventing harmful effects caused by oxidation of the lower electrode.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
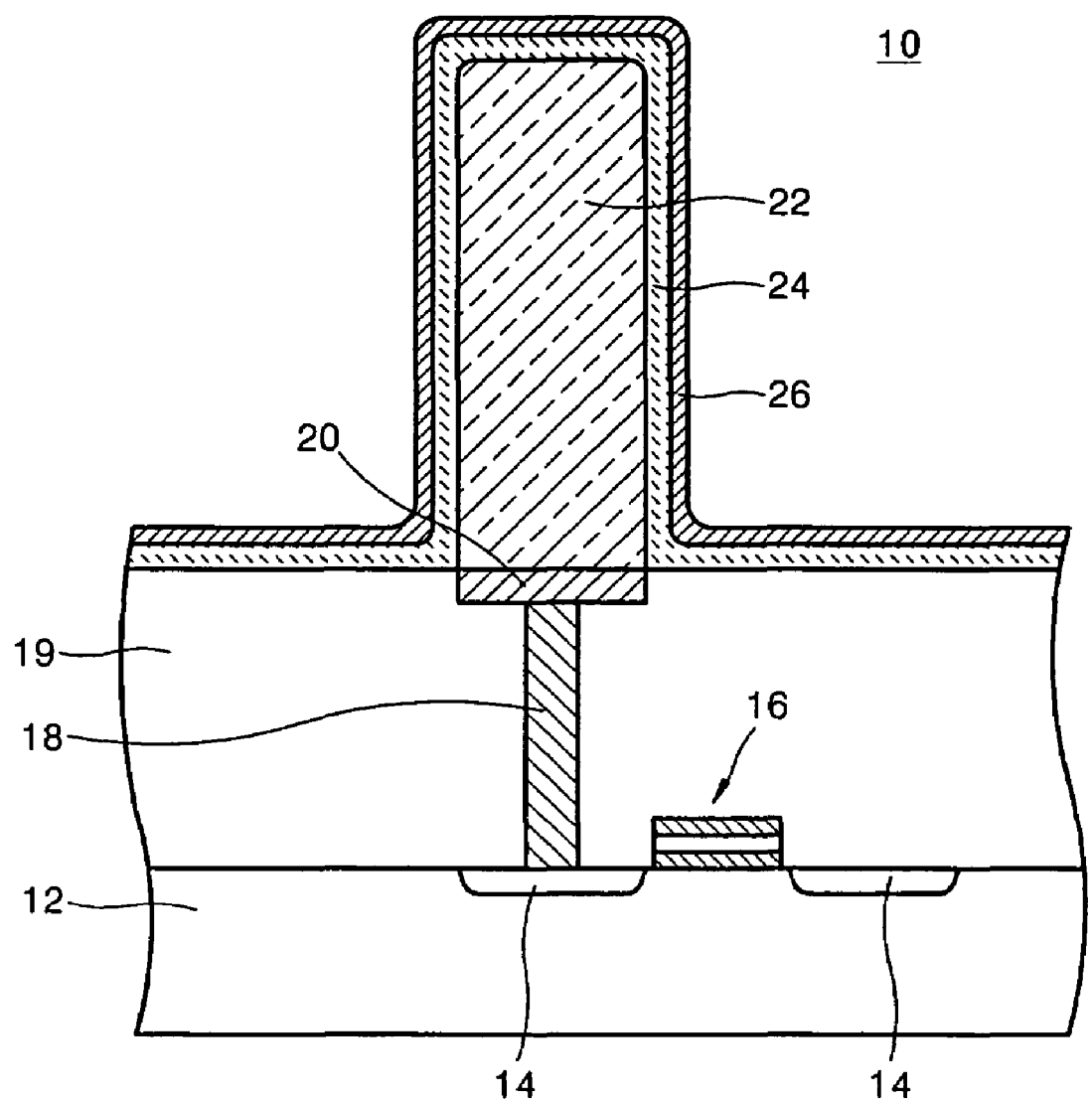
FIG. 1 is a sectional view illustrating a conventional semiconductor device with a capacitor structure.
Figure 2:
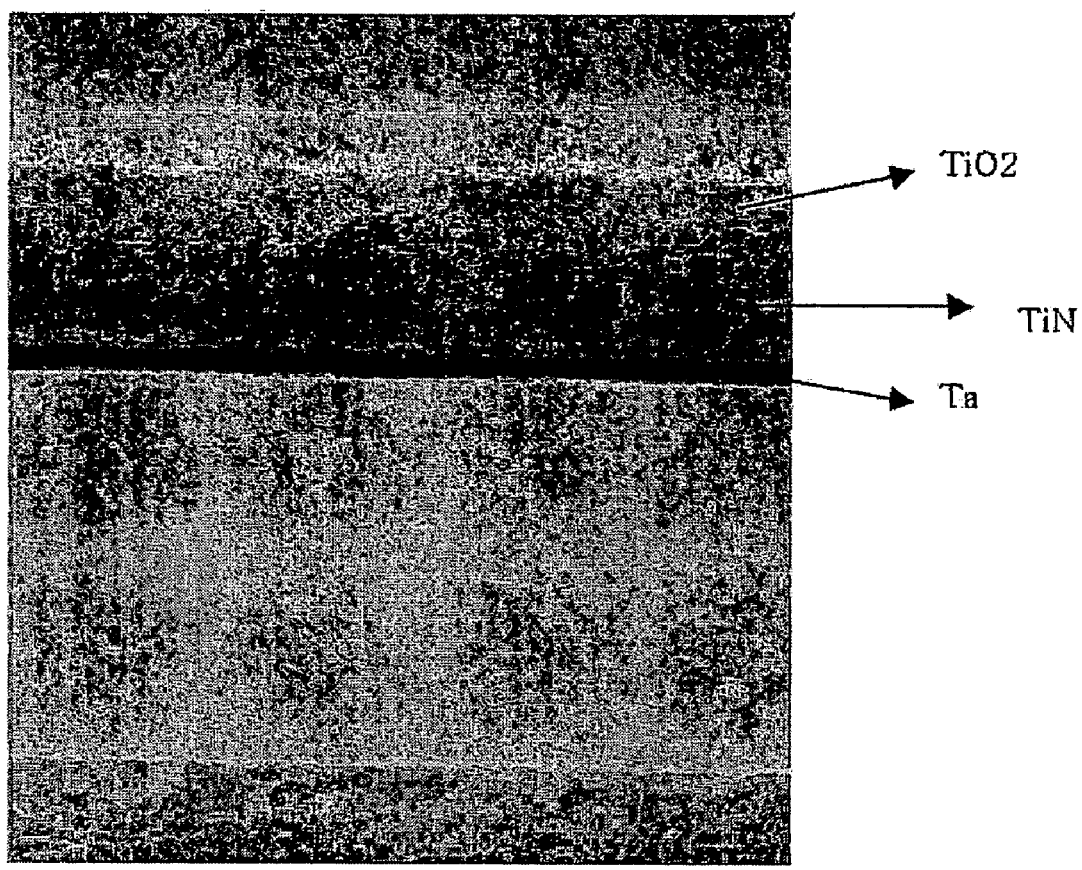
FIG. 2 is a photograph illustrating a configuration in which a TiO layer is formed on a TiN layer due to the influence of $O_3$ and a H—k oxide that are used when a conventional capacitor structure is manufactured.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

Figure 3:
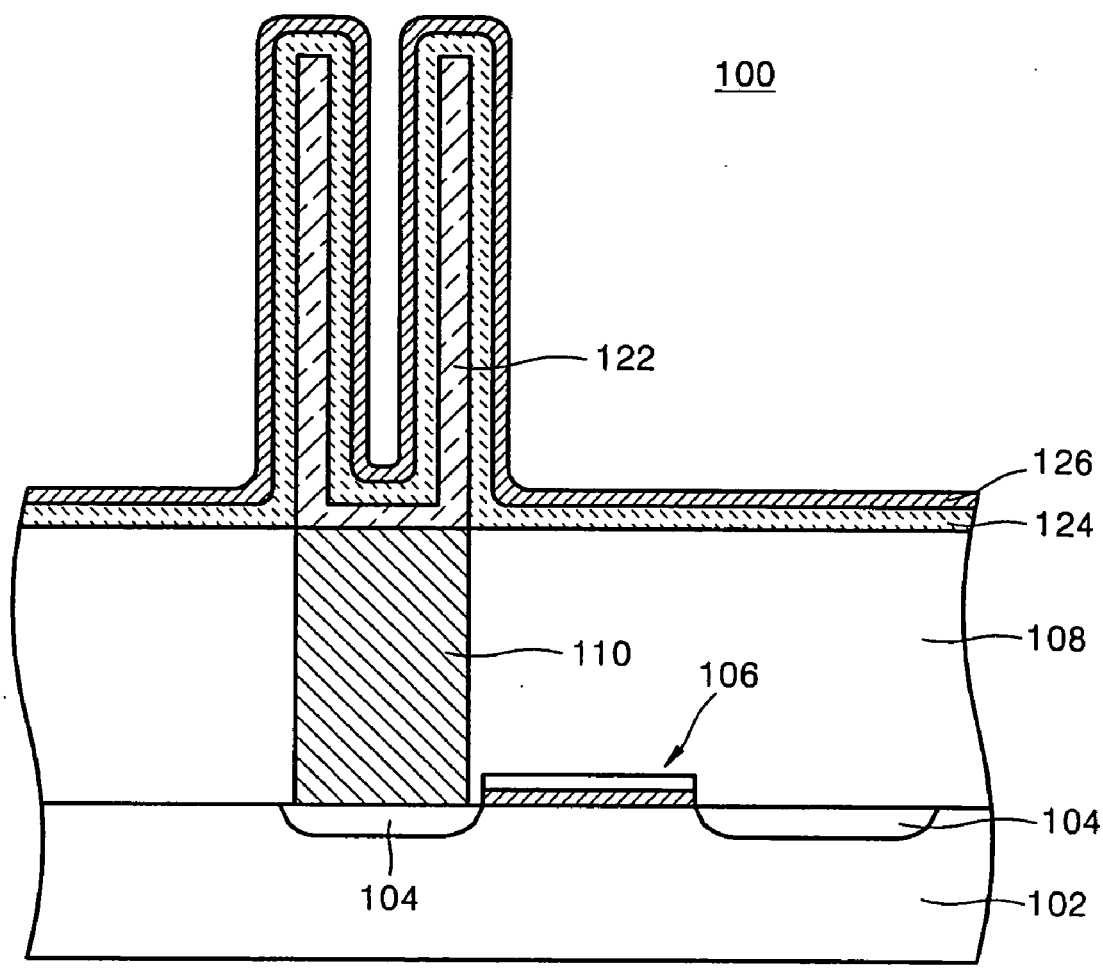
FIG. 3 is a sectional view illustrating a semiconductor device with a capacitor structure according to a preferred embodiment of the present invention.

FIG. 3 is a sectional view illustrating a semiconductor device with a capacitor structure according to a preferred embodiment of the present invention.

Referring to FIG. 3, the semiconductor device 100 with a capacitor structure according to a preferred embodiment of the present invention includes a semiconductor substrate 102; a source and drain region 104 formed at a predetermined distance in a semiconductor substrate 102; a gate structure 106 electrically connected to the source and drain region 104; an interlayer dielectric (ILD) film 108 for performing interlayer insulation; a lower electrode 122 formed on the interlayer dielectric film 108; and a dielectric layer 124 and an upper electrode 126 with a high dielectric constant.

Further, a conductive plug 110 passes through the interlayer dielectric film 108 to electrically connect the lower electrode 122 with the source and drain region 104.

According to a preferred embodiment of the present invention, the conductive plug 110 uses a conductive material such as silicon. However, if other materials allow the electrical conduction between the lower electrode 122 and the source and drain region 104 that is formed in the semiconductor substrate 102, it does not matter that the conductive plug 110 can be formed of the other materials.

FIGS. 4A through 4F are sectional views illustrating a method of manufacturing the semiconductor device with the capacitor structure according to a preferred embodiment of the present invention.

Figure 4A:
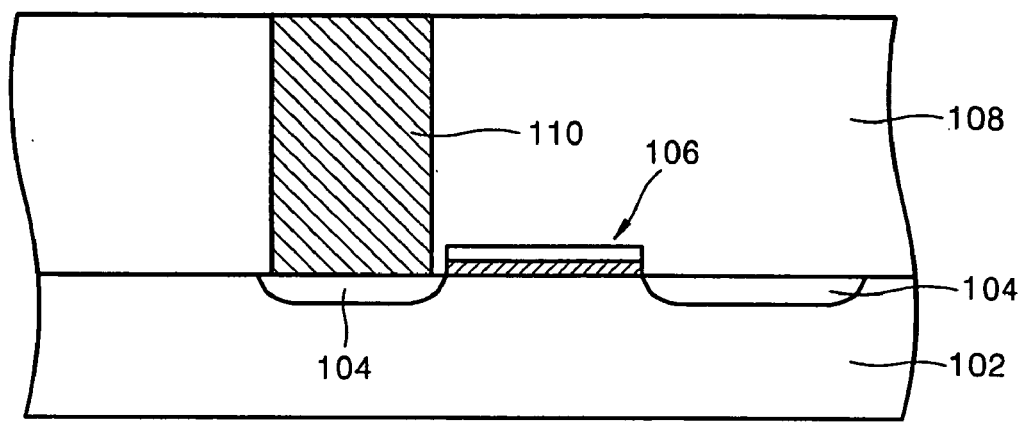
FIGS. 4A through 4F are sectional views illustrating a method of manufacturing a semiconductor device with a capacitor structure according to a preferred embodiment of the present invention.

First, as shown in FIG. 4A, the semiconductor substrate 102 is provided with the source and drain region 104 and the gate structure 106. After that, the interlayer dielectric film 108, which is formed of an insulating film such as a silicon oxide film, is formed on the semiconductor substrate 102. The interlayer dielectric film 108 is formed to a thickness that is enough to insulate overlying layers to be formed sequentially on the semiconductor substrate 102.

Next, the interlayer dielectric film 108 is patterned using photolithography and etching to open the underlying source and drain region 104. Next, the opened source and drain region 104 are filled with an electrically conductive material to complete the conductive plug 110. The conductive plug 110 may be formed of silicon.

Figure 4B:
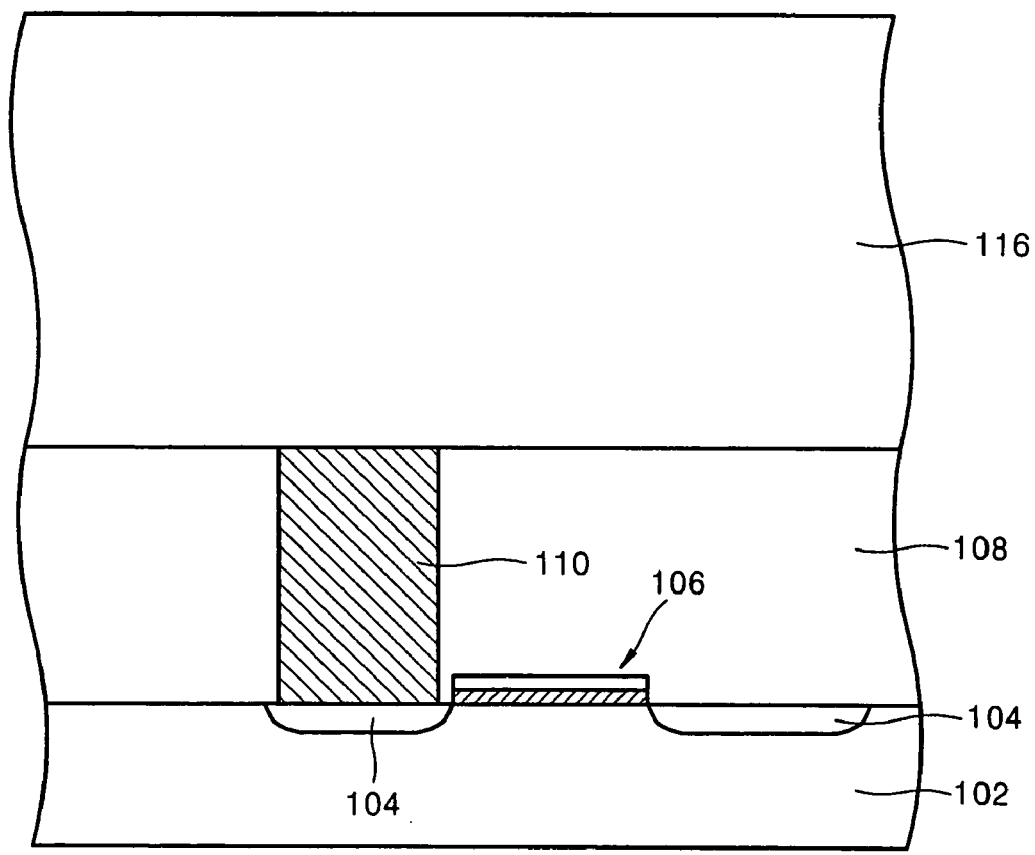

As shown in FIG. 4B, a mold oxidation layer 116 is deposited to a thickness that is enough to form a lower electrode of the capacitor using, for example, chemical vapor deposition (CVD), on the interlayer dielectric film 108 and the conductive plug 110. After that, the mold oxidation layer 116 can be also planarized using chemical mechanical polishing (CMP).

Figure 4C:
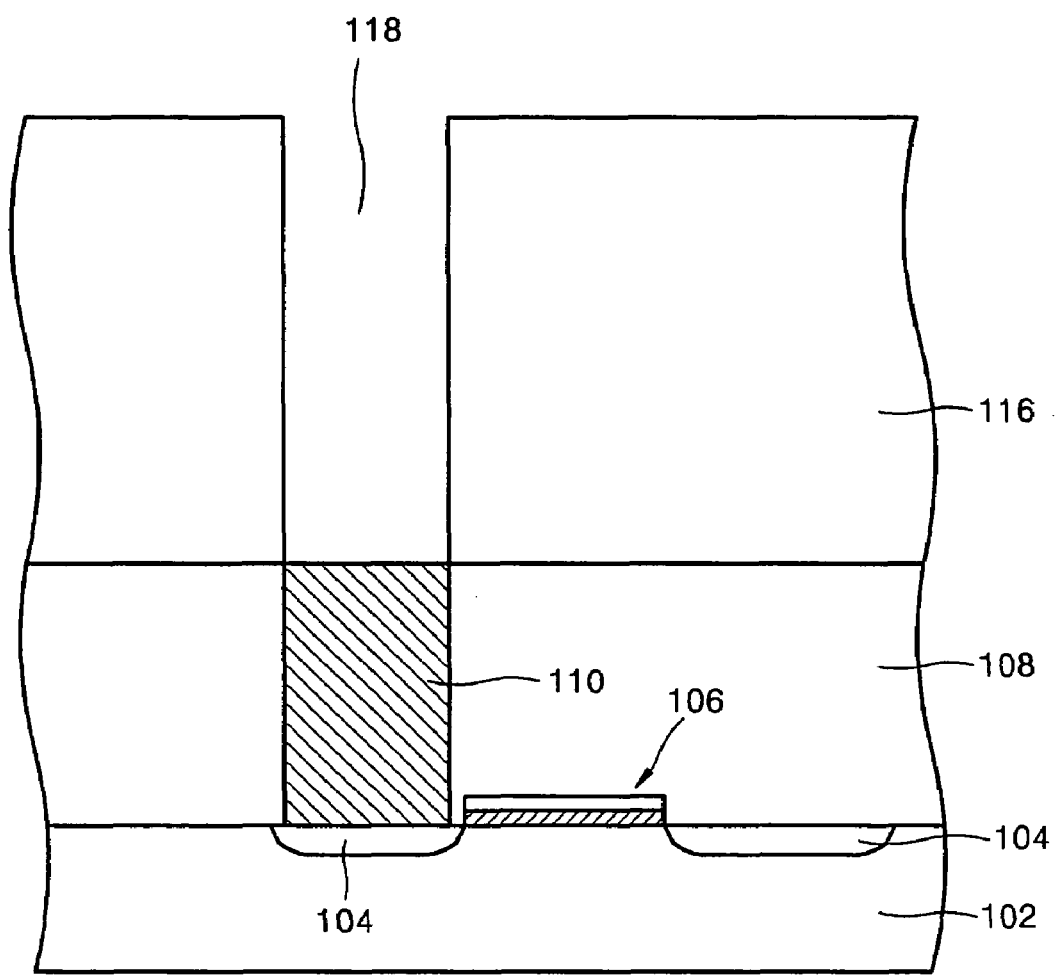

As shown in FIG. 4C, the mold oxidation layer 116 is etched according to a predetermined pattern to open the conductive plug 110 such that the mold oxidation layer 116 has a contact hole 118.

Figure 4D:
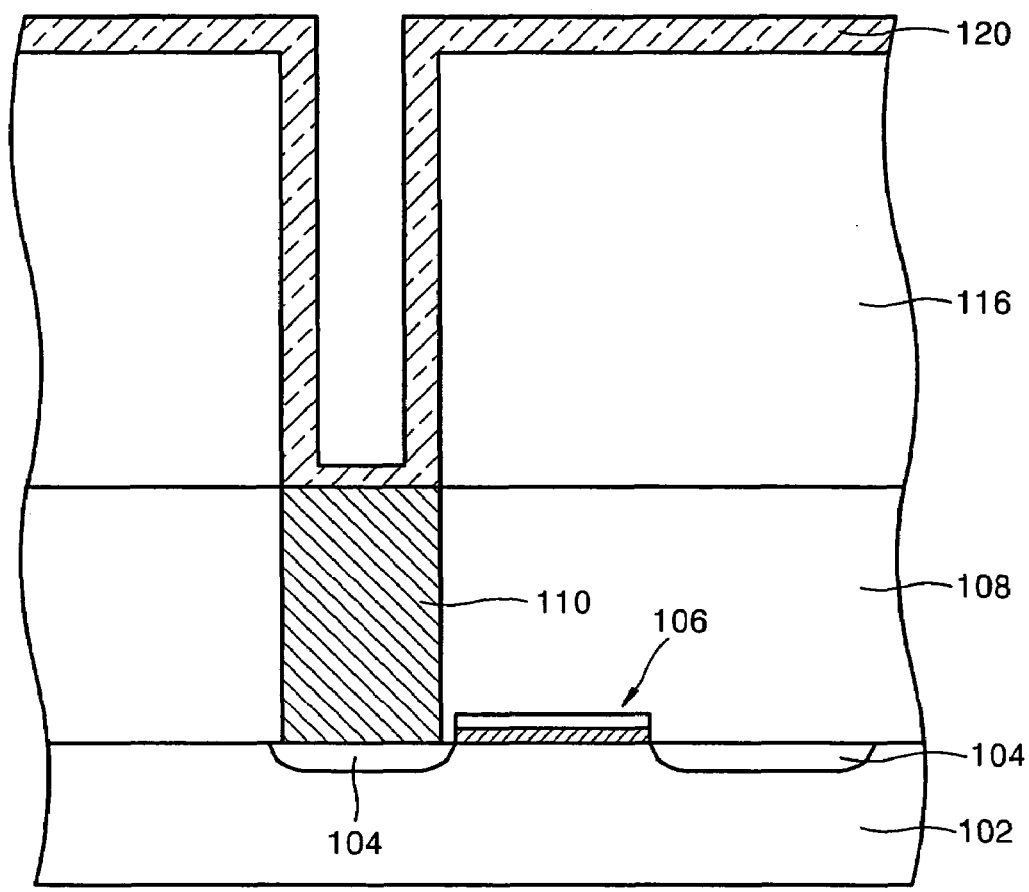

As shown in FIG. 4D, if a mixture gas of a material such as $TiA_4$ and aluminum ligand such as trimethyl aluminum ($Al[CH_3]_3$) flows on the conductive plug 110 and the mold oxidation layer 116, a TiAl layer is formed on the conductive plug 110 and the mold oxidation layer 116 while HA and $CO_2$ emit out in gas form. Here, "A" denotes halogen such as fluorine (F), chlorine (Cl), iodine (I) or bromine (Br).

After that, if $NH_3$ gas flows on the TiAl layer, a TiAlN layer is formed whlie HA emits out in gas form. The above process is repeated to deposit the TiAlN layer at a desired thickness. Accordingly, the TiAlN layer is resultantly formed as a lower electrode layer 120 on the conductive plug 110 and the mold oxidation layer 116. According to a preferred embodiment of the present invention, the mold oxidation layer 116 is formed of $SiO_2$ and a silicon oxide.

Figure 4E:
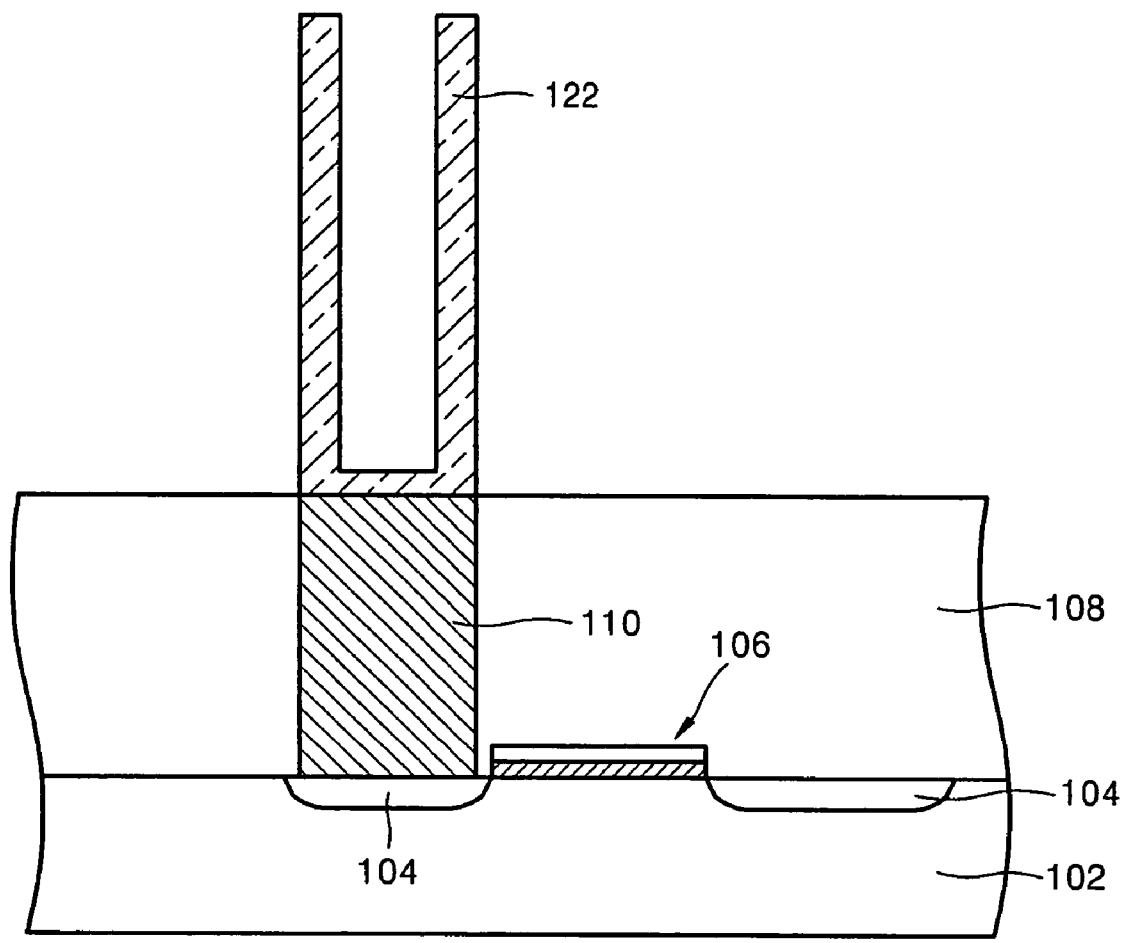

As shown in FIG. 4E, after the lower electrode layer 120 is etched-back until an upper surface of the mold oxidation layer 116 is exposed, the mold oxidation layer 116 is removed. As a result, a lower electrode 122 is obtained. Though not illustrated in the drawings, but in the removing of the mold oxidation layer 116 after formation of the conductive plug 110, an etching prevention layer can be also further formed for the purpose of preventing the etching of the interlayer dielectric film 108.

Figure 4F:
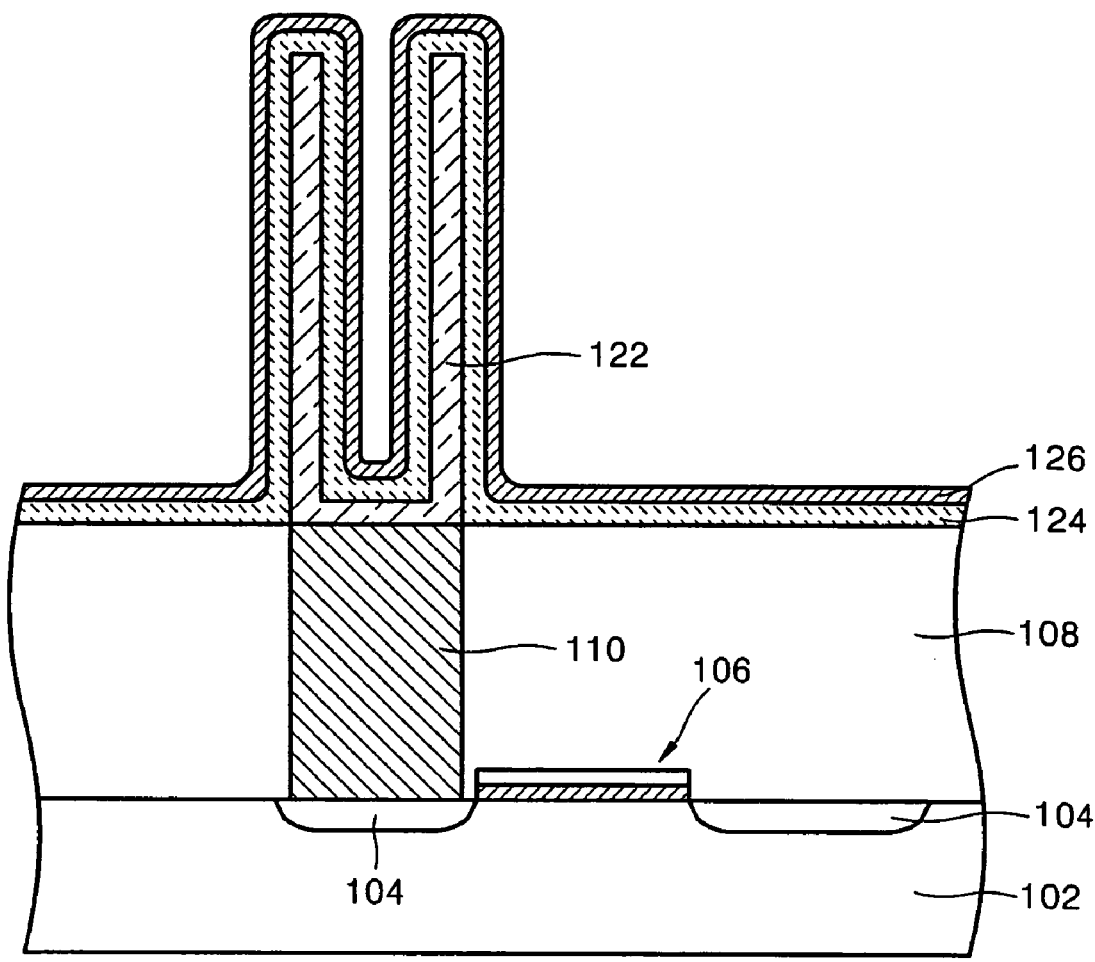

As shown in FIG. 4F, the dielectric layer 124 with the high dielectric constant and the upper electrode 126 are sequentially formed on the lower electrode 122 and the exposed interlayer dielectric film 108 so as to complete the semiconductor device 100 with the capacitor structure according to a preferred embodiment of the present invention.

According to a preferred embodiment of the present invention, the dielectric layer 124 is formed of $LaO_x$ or $HfO_x$, but can be also formed using material such as BST ($(Ba,Sr)TiO_3$ (barium strontium titanium oxide) and $ZrO_x$.

Further, according to an embodiment of the present invention, the lower electrode 122 is formed of TiAlN with the oxidation resistance to be prevented from being oxidized even when a subsequential process is performed using oxygen as the reaction gas. Accordingly, it does not matter that the upper electrode 126 employs an oxidation induction material such as TiN or ruthenium (Ru).

Figure 5:
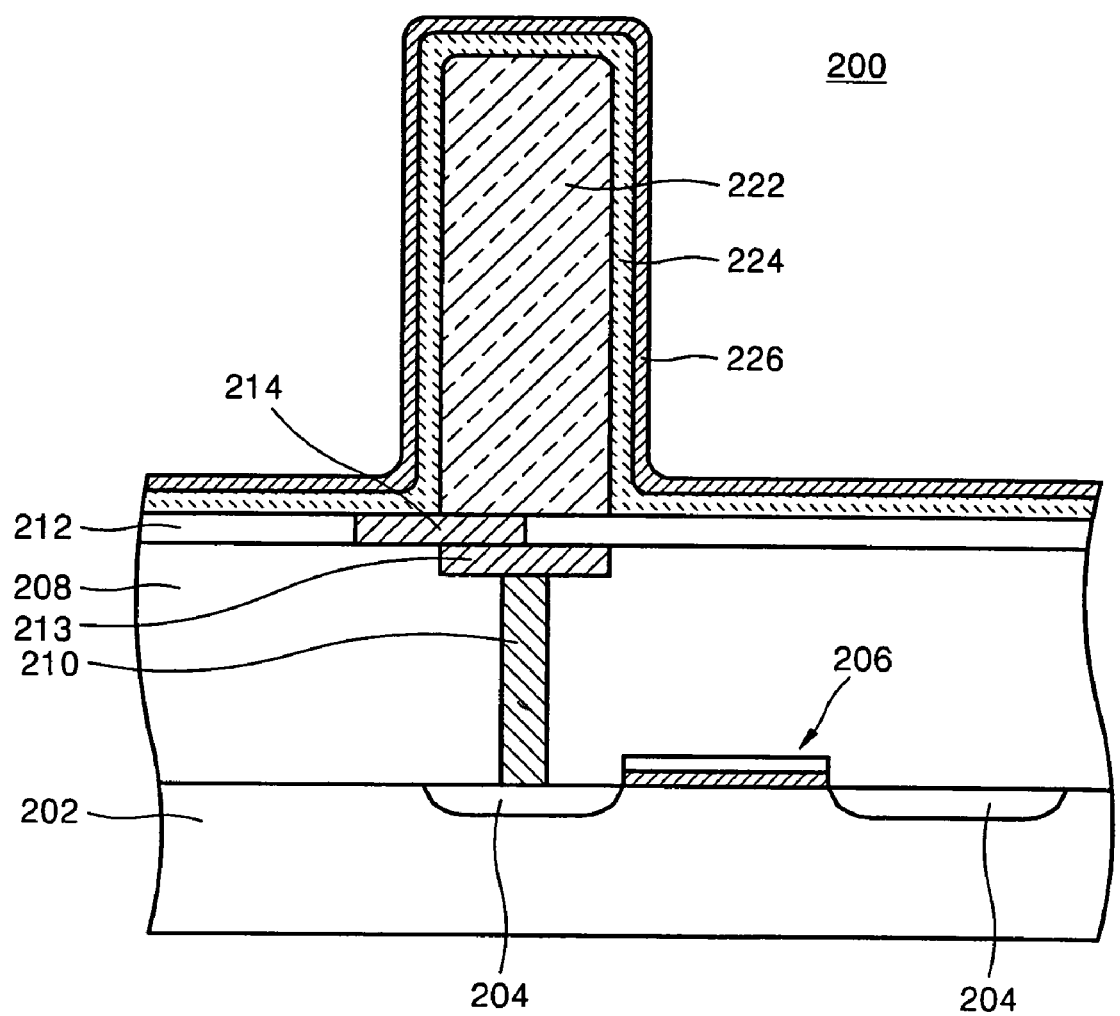
FIG. 5 is a sectional view illustrating a semiconductor device with a capacitor structure according to another embodiment of the present invention.

FIG. 5 is a sectional view illustrating the semiconductor device with the capacitor structure according to another embodiment of the present invention.

Referring to FIG. 5, the semiconductor device 200 with the capacitor structure according to another embodiment of the present invention includes a semiconductor substrate 202; a source and drain region 204 formed at a predetermined distance in the semiconductor substrate 202; a gate structure 206 electrically connected to the source and drain region 204; an ILD film 208 for performing interlayer insulation; and a lower electrode 222, a dielectric layer 224 with a high dielectric constant, and an upper electrode 226 that are sequentially formed on the ILD film 208.

Here, a conductive plug 210 passes through the interlayer dielectric film 208 to electrically connect the low electrode 222 with the source and drain region 204.

The conductive plug 210 uses a conductive material such as silicon. However, if other materials allow the electrical conduction between the lower electrode 222 and the source and drain region 204 that is formed in the semiconductor substrate 202, it does not matter that the conductive plug 210 can be formed of the other materials.

Further, a second diffusion prevention film 214 is formed of TiAlN or TaAlN between the lower electrode 222 and a first diffusion prevention film 213 that is formed on the conductive plug 210, so as to suppress a mutual diffusion or a chemical reaction occurring between the lower electrode 222 and the first diffusion prevention film 213 that is formed on the conductive plug 210.

Further, a conventional TiN layer for preventing oxidation and diffusion can be replaced with and formed of TiAlN through a process of forming the lower electrode 222 over the conductive plug 210 according to a preferred embodiment of the present invention. Accordingly, even though the lower electrode 222 is formed of a precious metal-based material, which can be easily oxidized, such as ruthenium (Ru) and iridium (Ir), the lower electrode 222 can be prevented from being oxidized in the subsequential process.

In another aspect of the present invention, TaAlN or an aluminum-doped metal instead of TiAlN can be used as the lower electrodes 122 and 222 and the second diffusion prevention film 214 as long as it prevents oxidation in the subsequential process.

FIGS. 6A through 6I are sectional views illustrating a method of manufacturing the semiconductor device with the capacitor structure according to another embodiment of the present invention.

Figure 6A:
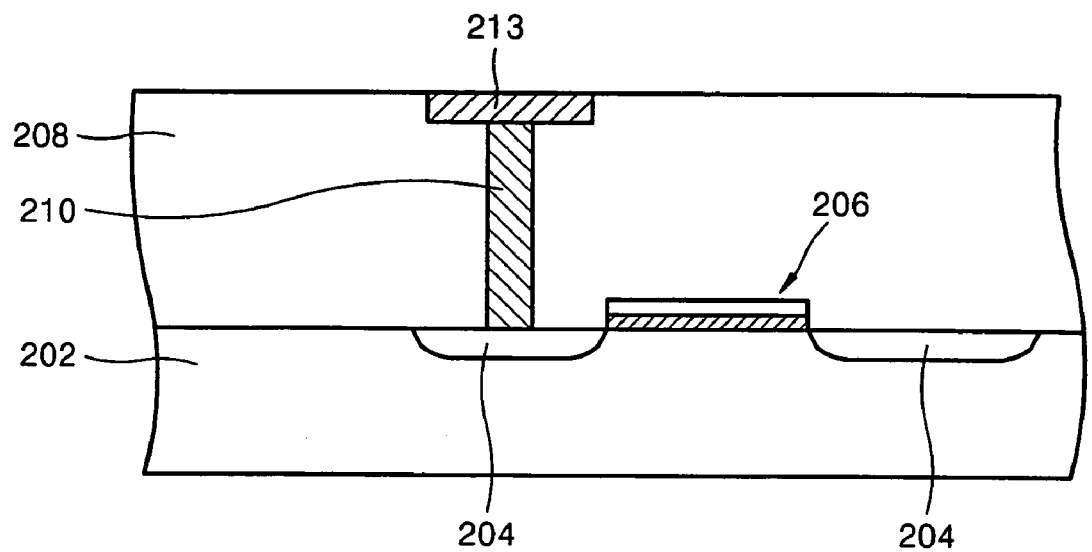
FIGS. 6A through 6I are sectional views illustrating a method of manufacturing a semiconductor device with a capacitor structure according to another embodiment of the present invention.

First, as shown in FIG. 6A, a semiconductor substrate 202 is provided with a source and drain region 204 and a gate structure 206. After that, an interlayer dielectric film 208, which is formed of an insulating film such as a silicon oxide film, is formed on the semiconductor substrate 202. At this time, the interlayer dielectric film 208 is formed at a thickness that is enough to insulate the overlying layer from the semiconductor substrate 202.

Next, the interlayer dielectric film 208 is patterned using photolithography and etching to open the source and drain region 204. After that, an electrically conductive material is formed on the opened source and drain region 204 to complete the conductive plug 210. At this time, the conductive plug 210 may be formed of silicon. And then, the first diffusion prevention film 213 is formed of TiN on the conductive plug 210.

Figure 6B:
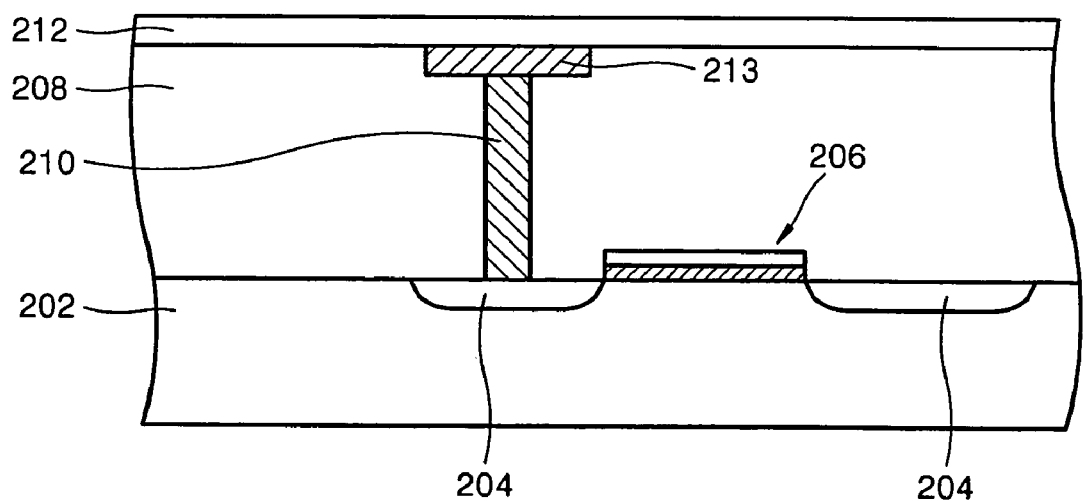

Next, as shown in FIG. 6B, an insulating film 212 is formed on the interlayer insulating film 208 and the first diffusion prevention film 213. At this time, the insulating film 212 is used to prevent the etching of the interlayer dielectric film 208 in a subsequential removing of the mold oxidation layer.

Figure 6C:
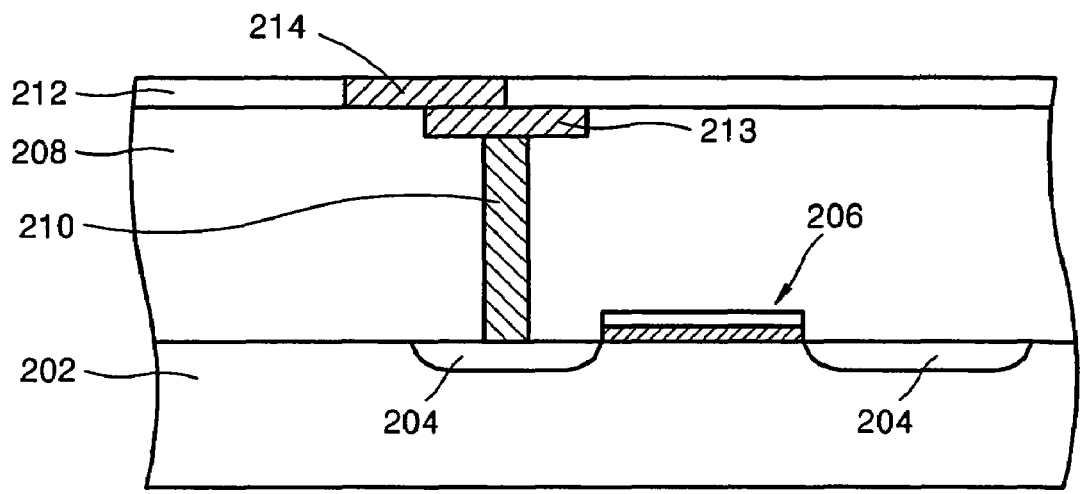

And then, as shown in FIG. 6C, the insulating film 212 is patterned to have a predetermined pattern in a photolithography and etching process to expose the first diffusion prevention film 213.

After that, a second diffusion prevention film 214 is formed of TiAlN on the exposed first diffusion prevention film 213 and the insulating film 212 as in detail described in the following.

First, if a mixture gas of a material such as $TiA_4$ and aluminum ligand such as trimethyl aluminum ($Al[CH_3]_3$) flows on the semiconductor substrate 202 including the first diffusion prevention film 213, a TiAl layer is formed while HA and $CO_2$ emit out in gas form. Here, "A" denotes halogen such as fluorine (F), chlorine (Cl), iodine (I) or bromine (Br).

After that, if $NH_3$ gas flows on the TiAl layer, a TiAlN layer is completed as the second diffusion prevention film 214 with HA emitting out in the form of gas. Accordingly, the second diffusion prevention film 214 is resultantly formed of TiAlN on the first diffusion prevention film 213.

Further, a conventional TiN layer for preventing oxidation and diffusion can be replaced with and formed of TiAlN through a process of forming the second diffusion prevention film 214 according to a preferred embodiment of the present invention. Accordingly, even though the conductive plug 210 is formed of a material, which can be easily oxidized, such as ruthenium (Ru) and TiN, the conductive plug 210 can be prevented from being oxidized in the subsequential process.

In another aspect of the present invention, TiAlN can be replaced with TaAlN or an aluminum-doped metal as the second diffusion prevention film 214 as long as it prevents oxidation in the subsequential process.

Figure 6D:
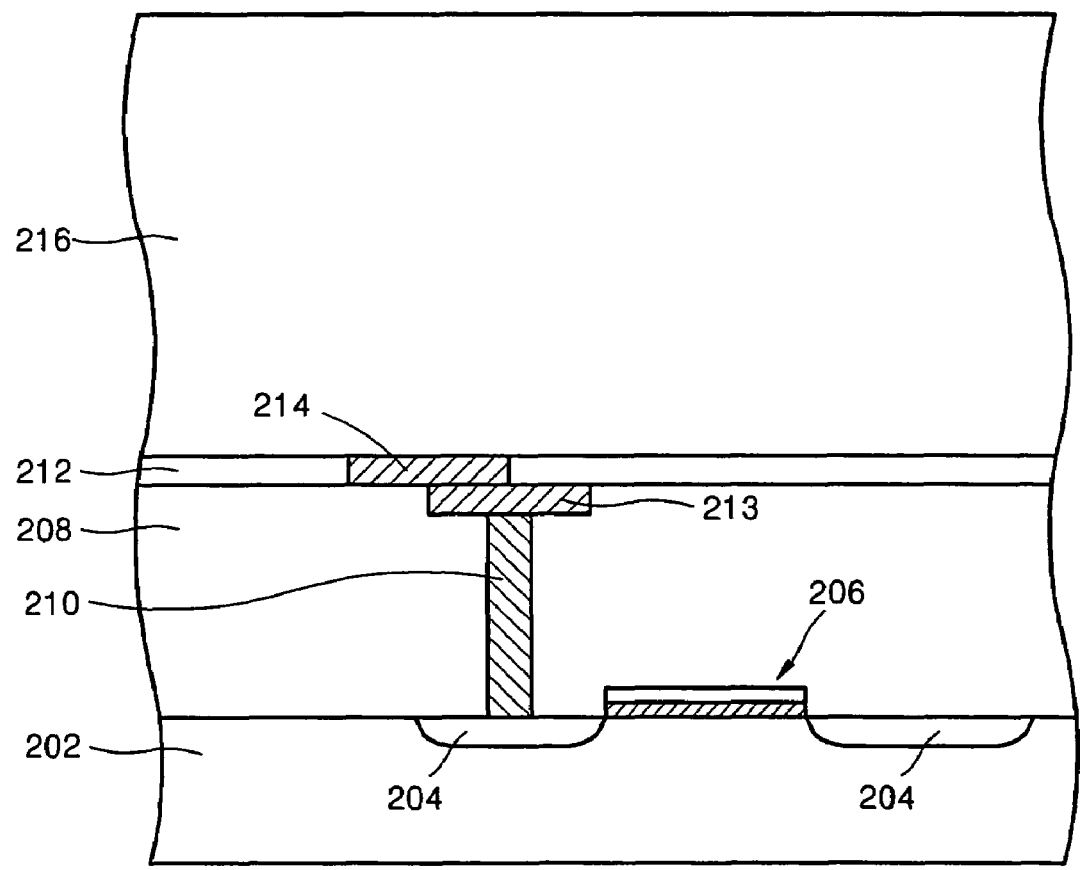

Next, as shown in FIG. 6D, a mold oxidation layer 216 is formed on the second diffusion prevention film 214 and the insulating film 212 at a thickness that is enough to form the lower electrode of the capacitor by using, for example, CVD. And then, the mold oxidation layer 216 can be also planarized using Chemical Mechanical Polishing (CMP).

Figure 6E:
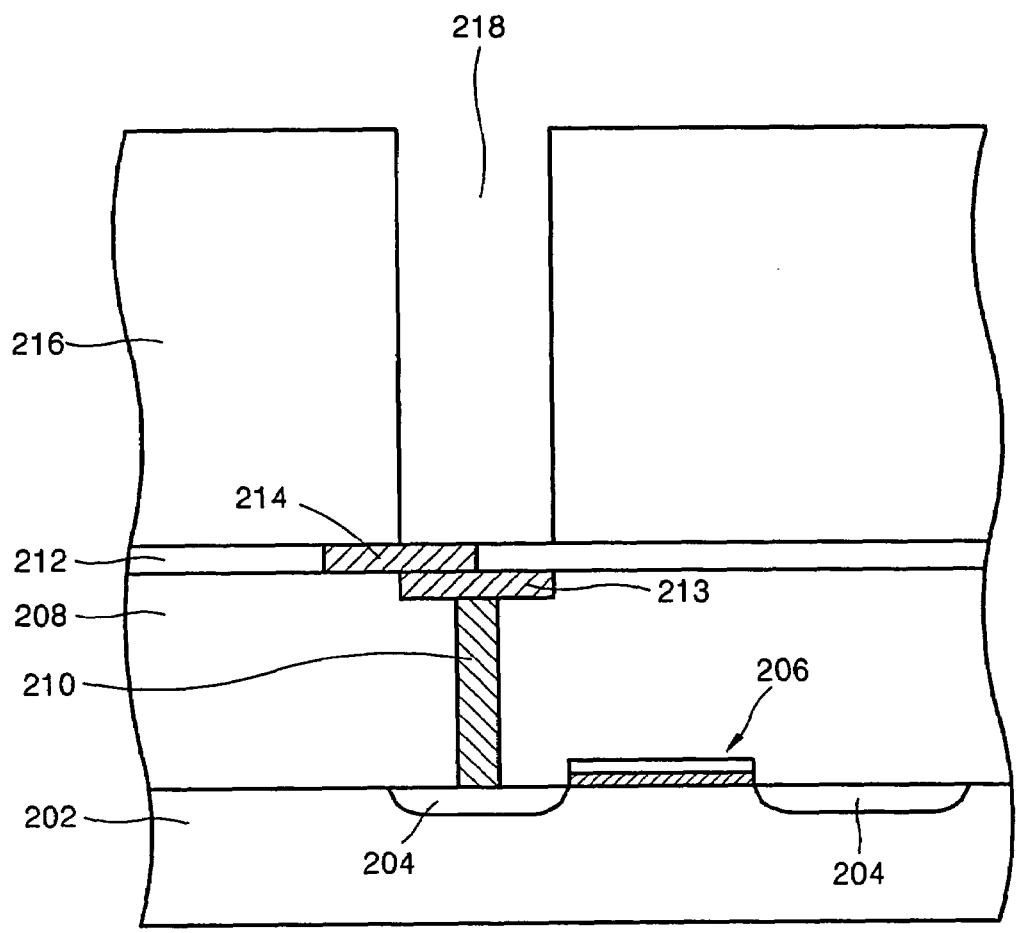

As shown in FIG. 6E, the mold oxidation layer 216 is etched according to a predetermined pattern to have a contact hole 218 therein for opening the second diffusion prevention film 214.

Figure 6F:
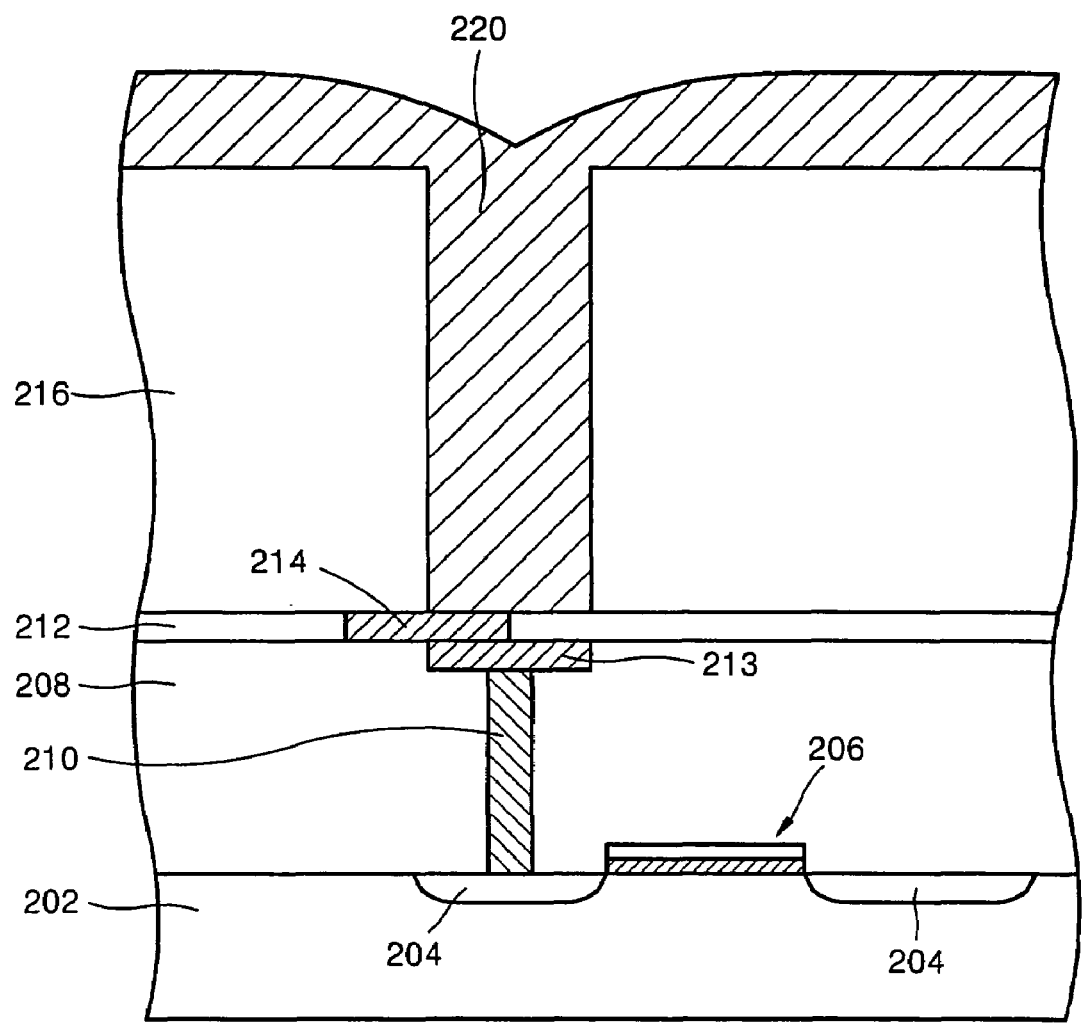

Next, as shown in FIG. 6F, a lower electrode layer 220 is formed of ruthenium and the like on the second diffusion prevention film 214 and the mold oxidation layer 216 to fill the contact hole 218. That is, the lower electrode layer 220 is formed of ruthenium according to another embodiment of the present invention as in detail described in the following.

First, a halogen-based material such as iodine is absorbed on a surface of the mold oxidation layer 216 with the contact hole 218. And then, the halogen-based material reacts with a ruthenium (Ru) precursor, which is used in Atomic Layer Deposition (ALD), to induce the decomposition of the ruthenium precursor.

Next, the ruthenium precursor is absorbed on the iodine-absorbed surface of the mold oxidation layer 216 having the contact hole 218. At this time, the absorbed iodine of the mold oxidation layer 216 reacts with the ruthenium precursor to decompose ruthenium from ligand of the ruthenium precursor. After remaining ruthenium precursor is purged, oxygen gas is absorbed on the remaining ruthenium precursor. The oxygen gas reacts with the ligand of the ruthenium precursor to decompose ruthenium from the ruthenium precursor, and the decomposed ruthenium reacts with oxygen to form a ruthenium oxide, thereby forming the lower electrode layer 220.

The forming of the lower electrode layer 220 using ruthenium is in detail described as above, but it does not matter that the lower electrode layer 220 is formed of TiN, or TiAlN that is used when the second diffusion prevention film 214 is formed.

Figure 6G:
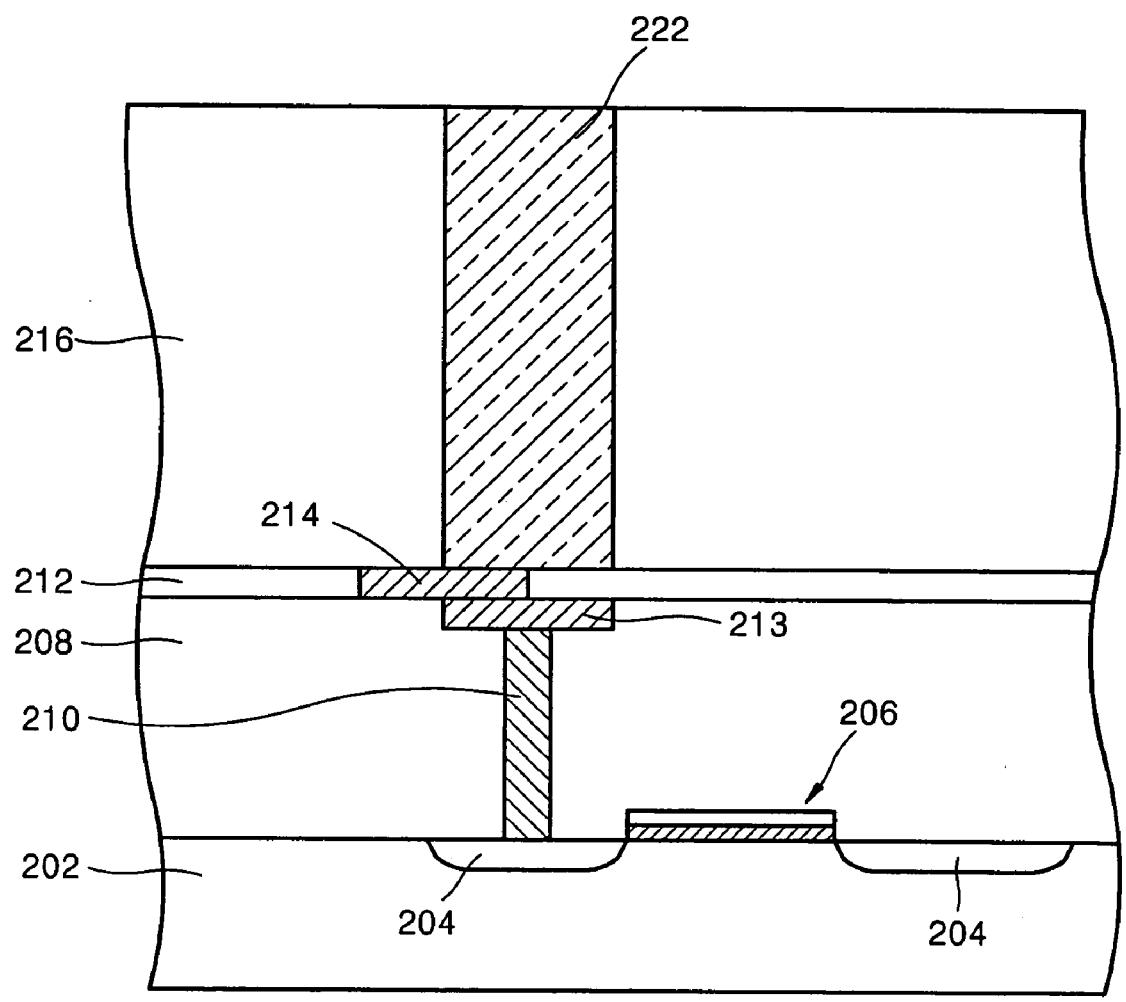
Figure 6H:
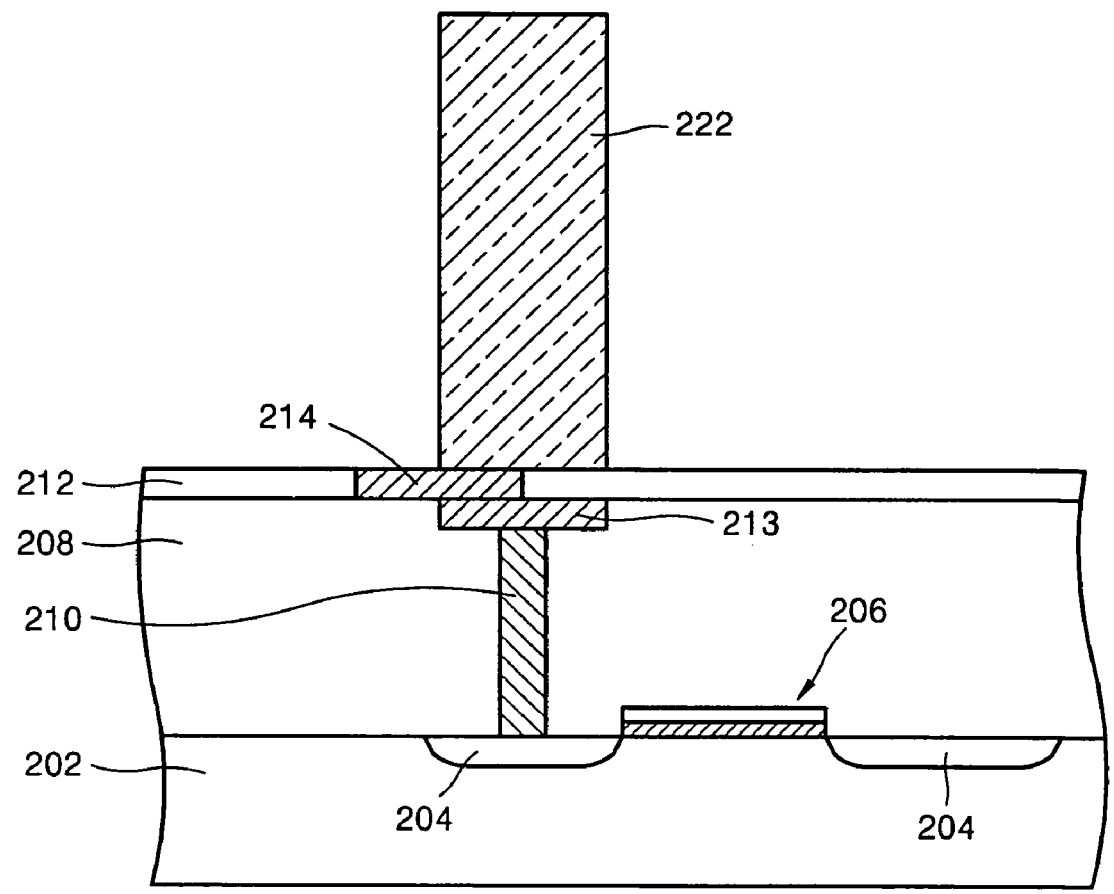

After that, as shown in FIG. 6G, after the lower electrode layer 220 is etched-back until an upper surface of the mold oxidation layer 216 is exposed, the mold oxidation layer 216 is removed. Resultantly, a lower electrode 222 is obtained as shown in FIG. 6H.

Figure 6I:
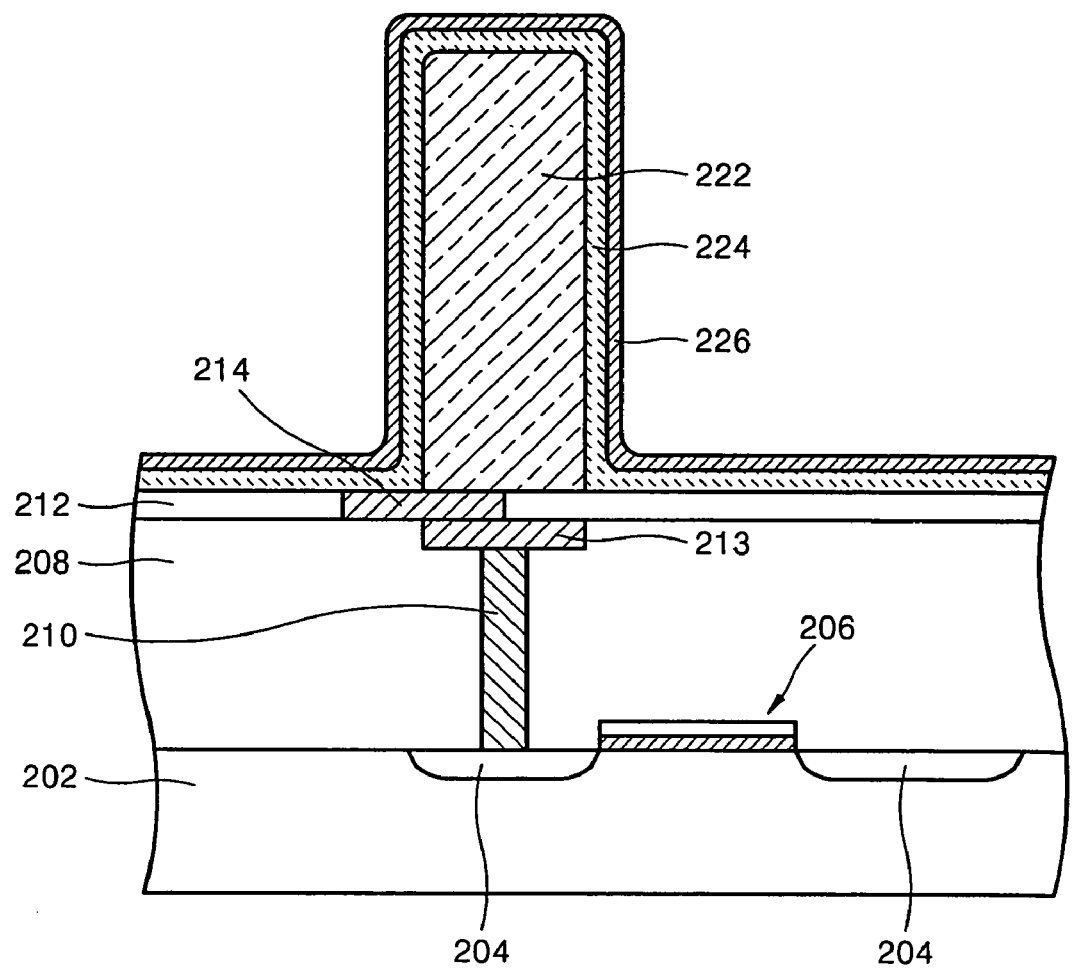

Next, as shown in FIG. 6I, the dielectric layer 224 and the upper electrode 226 are sequentially formed on the lower electrode 222 and the exposed insulating film 212, thereby completing the semiconductor device with the capacitor structure.

The second diffusion prevention film 214 is formed of an oxidation resistance material for preventing oxidation such as TiAlN or TaAlN, on the first diffusion prevention film 213 that is formed on the conductive plug 210. Accordingly, the lower electrode or the oxidation prevention film can be prevented from being oxidized even when the lower electrode and the upper electrode are formed of TiN or ruthenium in the subsequential process using the reaction gas containing oxygen.

Figure 7:
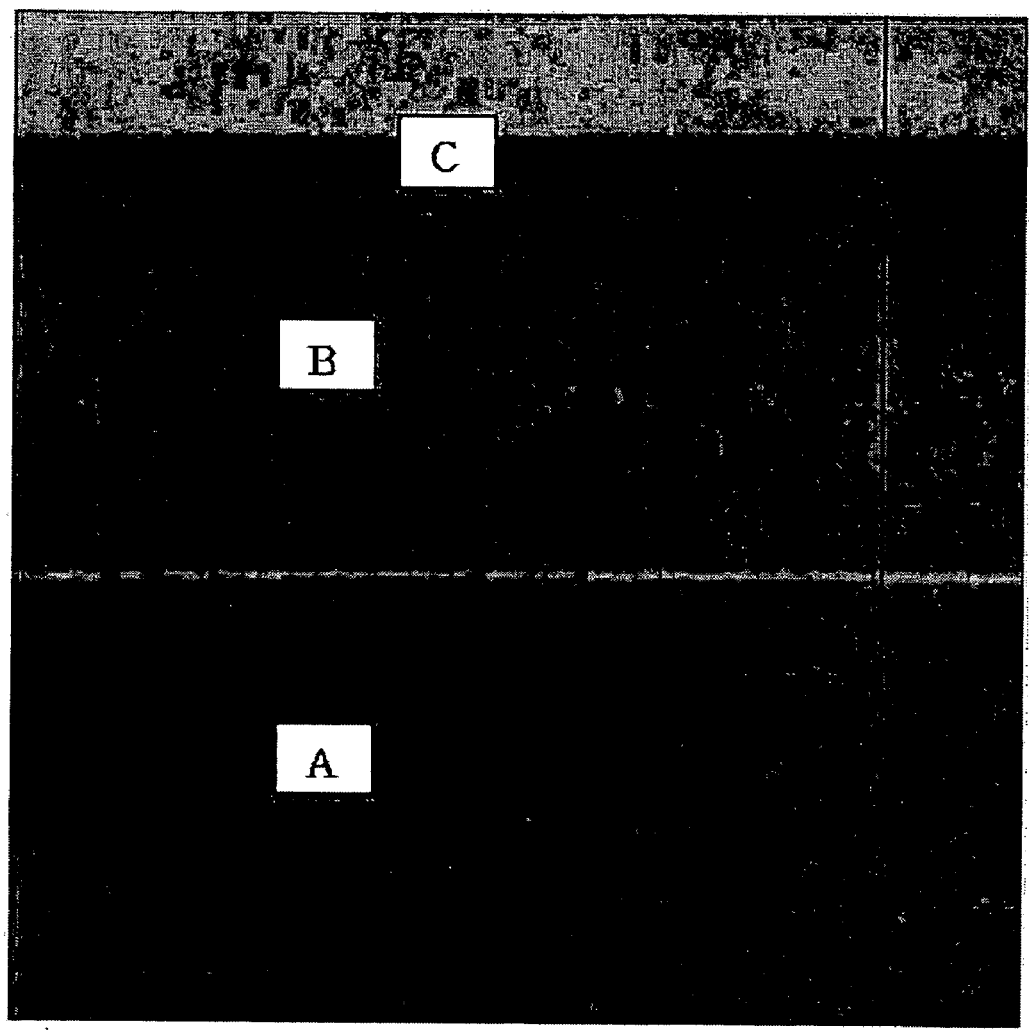
FIG. 7 is a Transmission Electron Microscopy (TEM) photograph illustrating an interfacial structure of TiAlN/LaO that constructs a lower electrode of a capacitor structure according to a preferred embodiment of the present invention.

FIG. 7 is a Transmission Electron Microscopy (TEM) photograph illustrating an interfacial structure of TiAlN layer/$LaO_2$ layer that construct the lower electrode of the capacitor structure according to the present invention. Here, reference numerals "A", "B" and "C" denote the semiconductor substrate, the TiAlN layer, and a $LaO_2$ layer respectively.

As shown in FIG. 7, even though the $LaO_2$ layer is formed as a high-dielectric layer in oxygen atmosphere, the inventive capacitor stack structure is greatly improved in comparison with a conventional capacitor stack structure.

As described above, the present invention has an effect in that the lower electrode and the diffusion prevention film are formed of the aluminium-doped metal such that the lower electrode and the diffusion prevention film are not oxidized even in the subsequential process using atmosphere containing oxygen.

Also, the present invention has an effect in that current leakage is improved by using the TiAlN layer as the lower electrode to prevent oxidation.

Further, the present invention has an effect in that the upper electrode can be formed of TiN or Ru with a large work function in the subsequential process by forming the lower electrode and/or the diffusion prevention film of the aluminium-doped metal.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device having a capacitor, the semiconductor device comprising:
    a semiconductor substrate having a gate structure and an active region;
    an interlayer dielectric film formed on the active region;
    a lower electrode formed on the interlayer dielectric film;
    a dielectric layer formed on the lower electrode;
    an upper electrode formed on the dielectric layer;
    a plug formed in the interlayer dielectric film to connect the active region and the lower electrode; and
    a diffusion prevention film formed of a metal doped with aluminum on the plug.

2. The semiconductor device of claim 1, wherein the plug is formed of a material containing silicon.

3. The semiconductor device of claim 1, wherein the lower electrode is formed of a material containing Ru or Ti.

4. The semiconductor device of claim 1, wherein the dielectric layer comprises $LaO_x$ or $HfO_x$ where x is between 0 and 3.

5. The semiconductor device of claim 1, wherein the upper electrode is formed of a material containing Ru or TiN.

6. A semiconductor device having a capacitor, the semiconductor device comprising:
    a semiconductor substrate having a gate structure and an active region;
    an interlayer dielectric film formed on the active region;

a lower electrode formed on the interlayer dielectric film;
a dielectric layer formed on the lower electrode;
an upper electrode formed on the dielectric layer;
a plug formed in the interlayer dielectric film to connect the active region and the lower electrode; and
a diffusion prevention film formed of a metal containing aluminum on the plug, wherein the diffusion prevention film is formed of a material containing TiAlN.

* * * * *